(12) United States Patent
Daniel et al.

(10) Patent No.: US 9,128,500 B2
(45) Date of Patent: Sep. 8, 2015

(54) SWITCHING CIRCUITS WITH VOLTAGE VALLEY DETECTION

(71) Applicant: NXP B.V., Eindhoven (NL)

(72) Inventors: Bobby Jacob Daniel, Eindhoven (NL); Wilhelmus Hinderikus Maria Langeslag, Wijchen (NL)

(73) Assignee: NXP B.V., Eindhoven (NL)

( * ) Notice: Subject to any disclaimer, the term of this patent is extended or adjusted under 35 U.S.C. 154(b) by 156 days.

(21) Appl. No.: 13/874,986

(22) Filed: May 1, 2013

(65) Prior Publication Data

US 2013/0307505 A1    Nov. 21, 2013

(30) Foreign Application Priority Data

May 18, 2012  (EP) .................................... 12168496

(51) Int. Cl.
G05F 1/625 (2006.01)
G05F 1/10 (2006.01)
H02M 3/156 (2006.01)
H02M 3/338 (2006.01)
H03K 17/16 (2006.01)
H03K 17/18 (2006.01)

(52) U.S. Cl.
CPC .............. *G05F 1/10* (2013.01); *H02M 3/1563* (2013.01); *H02M 3/3381* (2013.01); *H03K 17/163* (2013.01); *H03K 17/18* (2013.01)

(58) Field of Classification Search
CPC ... H02M 3/158; H02M 3/1588; H02M 3/156; H02M 3/1582; H02M 3/07; H02M 3/1584; H02M 3/157; H02M 3/33507; H02M 1/4208; H02M 2001/0012; H02M 2001/0032; H02M 2001/0009; H02M 2001/0045; H02M 2001/007; G05F 1/613; G05F 1/56; G05F 1/575; G05F 1/563; G05F 3/24
USPC ................. 323/223, 224, 265, 266, 282–285; 363/21.01, 89
See application file for complete search history.

(56) References Cited

U.S. PATENT DOCUMENTS

| 5,548,240 | A | * | 8/1996 | Bayer | 327/432 |
| 5,572,416 | A | * | 11/1996 | Jacobs et al. | 363/89 |
| 6,967,519 | B2 | | 11/2005 | Nakayama et al. | |

(Continued)

FOREIGN PATENT DOCUMENTS

| CN | 1445928 A | 10/2003 |
| CN | 102185466 A | 9/2011 |

(Continued)

OTHER PUBLICATIONS

Extended European Search Report for European Patent Appln. No. 12168496.3 (Apr. 24, 2013).

*Primary Examiner* — Gary L Laxton
*Assistant Examiner* — Kevin H Sprenger

(57) ABSTRACT

A switching circuit and a method of operating the same are disclosed. In an embodiment, the switching circuit includes a switching transistor adapted to control operation of the switching circuit according to a control signal applied to the control terminal of the switching transistor, a regulating circuit adapted to generate the control signal, and a detecting circuit adapted to sense a voltage at the control terminal when the switching transistor is in an OFF state and to generate a drive signal according to the sensed voltage. The regulating circuit is adapted to generate the control signal based on the generated drive signal.

6 Claims, 4 Drawing Sheets

(56) References Cited

U.S. PATENT DOCUMENTS

| | | | |
|---|---|---|---|
| 7,459,894 B2* | 12/2008 | Li et al. | 323/285 |
| 7,898,823 B2 | 3/2011 | Wu | |
| 8,466,982 B2* | 6/2013 | Liu et al. | 348/222.1 |
| 8,917,068 B2 | 12/2014 | Chen et al. | |
| 2005/0134358 A1* | 6/2005 | Pham | 327/427 |
| 2006/0033551 A1* | 2/2006 | Dong et al. | 327/427 |
| 2007/0057656 A1* | 3/2007 | Mayell et al. | 323/282 |
| 2008/0278974 A1 | 11/2008 | Wu | |
| 2009/0066402 A1 | 3/2009 | Hiyama | |
| 2009/0296437 A1* | 12/2009 | Li et al. | 363/89 |
| 2010/0141326 A1 | 6/2010 | Tumminaro et al. | |
| 2010/0195354 A1* | 8/2010 | Lin | 363/21.01 |
| 2012/0188001 A1* | 7/2012 | Mizobe et al. | 327/427 |
| 2012/0299561 A1 | 11/2012 | Chen et al. | |

FOREIGN PATENT DOCUMENTS

| | | |
|---|---|---|
| JP | 2001119287 | 4/2001 |
| WO | 2009/037613 A1 | 3/2009 |
| WO | 2009/128023 A1 | 10/2009 |

* cited by examiner

SWITCHING CIRCUITS WITH VOLTAGE VALLEY DETECTION

CROSS-REFERENCE TO RELATED APPLICATIONS

This application claims the priority under 35 U.S.C. §119 of European patent application no. 12168496.3, filed on May 18, 2012, the contents of which are incorporated by reference herein.

This invention relates to switching circuits such as convertors.

BACKGROUND

In self oscillating converters, such as boundary conduction mode buck converters, the detection of a lowest voltage in a voltage swing (i.e. the trough a voltage valley) may be required for determining when to turn on a switch in order to minimize hard-switching. Hard-switching results in significant power dissipation into the switch. Switching on at the lowest point of a drain voltage swing of a MOSFET switch reduces this power dissipation and therefore helps to operate at improved efficiency.

By way of enabling a better understanding, the circuit diagram of a conventional boundary conduction-mode buck converter 10 is shown in FIG. 1A. FIG. 1B shows the variation of gate 11 and drain 13 voltage for the MOSFET switch 12 and the variation of output current 15 over the duration of a switching cycle.

In the first part of the cycle (i.e. in the first stroke), the gate voltage 11 is at a HIGH value and the MOSFET switch 12 is on. The current 15 in the inductor rises linearly to a predetermined peak value, which is sensed, and then the switch is turned off and the second part of the cycle (i.e. the second stroke) is entered. In the second stroke, the gate voltage 11 of the MOSFET switch 12 is at a LOW value and the current in the inductor drops linearly until it reaches zero. When the current in the inductor reaches zero, the voltage at the drain 13 of the MOSFET switch 12 swings due to resonance between the drain capacitance and the inductor. When the gate voltage 11 is then reverted back to a HIGH value (and the MOSFET switch 12 is thus switched on as a result) the drain-capacitor-charge into the MOSFET switch 12 is dissipated and the current 15 rises linearly once again.

As mentioned above, switching on the MOSFET switch 12 at the low value of the drain voltage swing (i.e. at the trough of the voltage valley) is known to be preferable so as to reduce power dissipation into the MOSFET switch 12.

In conventional implementations, the voltage valley is detected by sensing one terminal of a capacitor in the integrated circuit (IC), whose other end is connected to the drain. Such a known approach to detecting the voltage valley is shown in FIG. 2. This requires (a) the drain node to be accessible from the IC, and (2) high voltage capacitor inside the IC.

For controller-only ICs this is not feasible because the drain node is not accessible. Further, it would require either an extra pin with an internal high-voltage (HV) cap (which then necessitates HV components in the IC), or an extra pin with an external HV cap. This results in increased cost and reduced accuracy.

A known alternative approach to detecting a voltage valley is to use a capacitance from the MOSFET drain to a sense pin of the controller. However, this has the disadvantage of requiring an additional HV capacitor and HV resistor.

SUMMARY

According to an aspect of the invention there is provided a switching circuit according to the independent claims.

Embodiments introduce a concept of voltage valley detection using only the control portion of the switch (e.g. the gate of a MOSFET switch, or the base of a BJT) which is driven by the circuit controller.

According to an aspect of the invention, there is provided a switching circuit comprising: a switching transistor adapted to control operation of the switching circuit according to a control signal applied to the control terminal of the switching transistor; a regulating circuit adapted to generate the control signal; and a detecting circuit adapted to sense a voltage at the control terminal when the switching transistor is in an OFF state and to generate a drive signal according to the sensed voltage, wherein the regulating circuit is adapted to generate the control signal based on the generated drive signal.

Embodiments may therefore sense a voltage at the gate of a MOSFET switch, which is also connected to the DRIVER pin of a controller IC, in order to detect the trough of a voltage valley. Thus, a controller pin may be provided with a dual functionality, thereby negating the need for a dedicated voltage valley sense pin.

According to another aspect of the invention, there is provided a method of controlling a switching circuit comprising a switching transistor having a control terminal, the method comprising: generating a control signal; applying the control signal to the control terminal of the switching transistor; sensing a voltage at the control terminal when the switching transistor is in an OFF state; generating a drive signal according the sensed voltage; and wherein the control signal is generated according to the generated drive signal.

Embodiments may therefore employ sensing of the current or voltage at an IC controller pin connected to the gate of the external MOSFET switch in order to detect the trough of a voltage valley.

BRIEF DESCRIPTION OF THE DRAWINGS

Examples of the invention will now be described in detail with reference to the accompanying drawings, in which.

DETAILED DESCRIPTION OF THE EMBODIMENTS

Embodiments use information from the control terminal of a switch in order to sense the lowest voltage in a voltage swing (i.e. the trough a voltage valley). A control terminal is therefore provided with dual functionality so a dedicated valley sense terminal is not required.

Figure 1A:
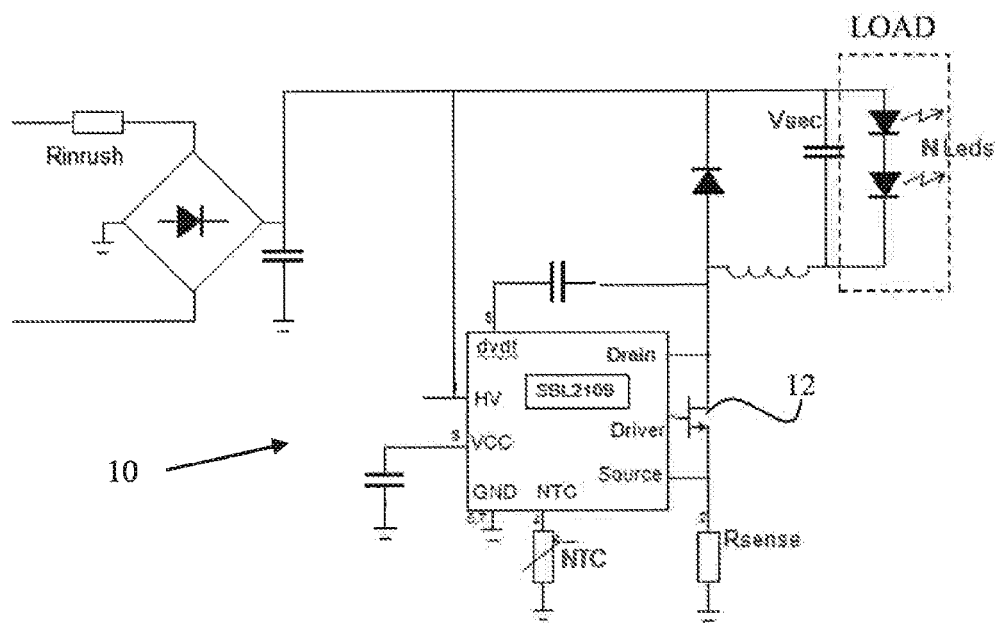
FIG. 1A is a circuit diagram of a conventional boundary conduction-mode buck converter.
Figure 1B:
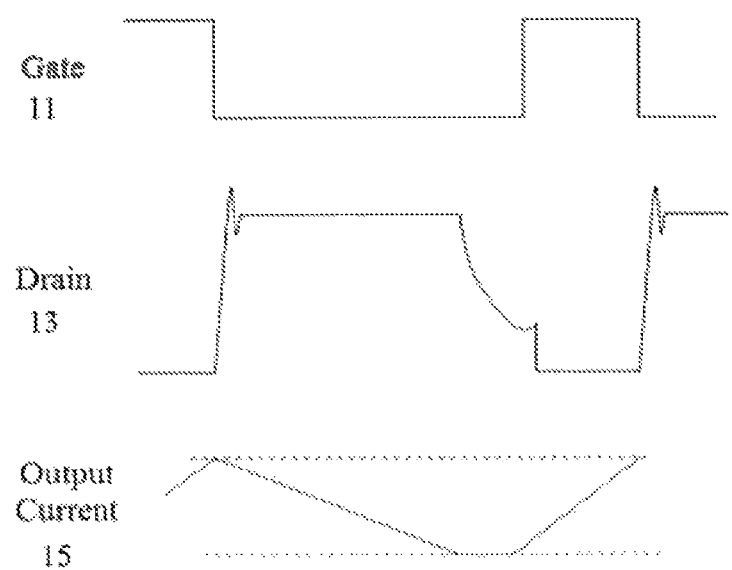
FIG. 1B shows the variation of gate voltage, drain voltage and output current for the convertor of FIG. 1A during a switching cycle.
Figure 2:
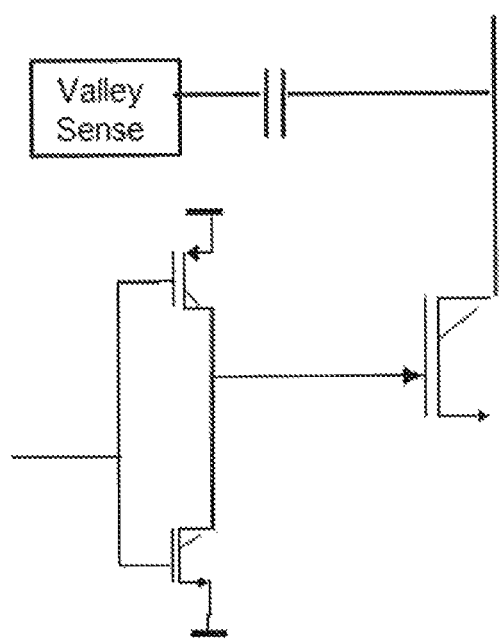
FIG. 2 shows a circuit employing a known approach to detecting a voltage valley in a switching circuit.
Figure 3A:
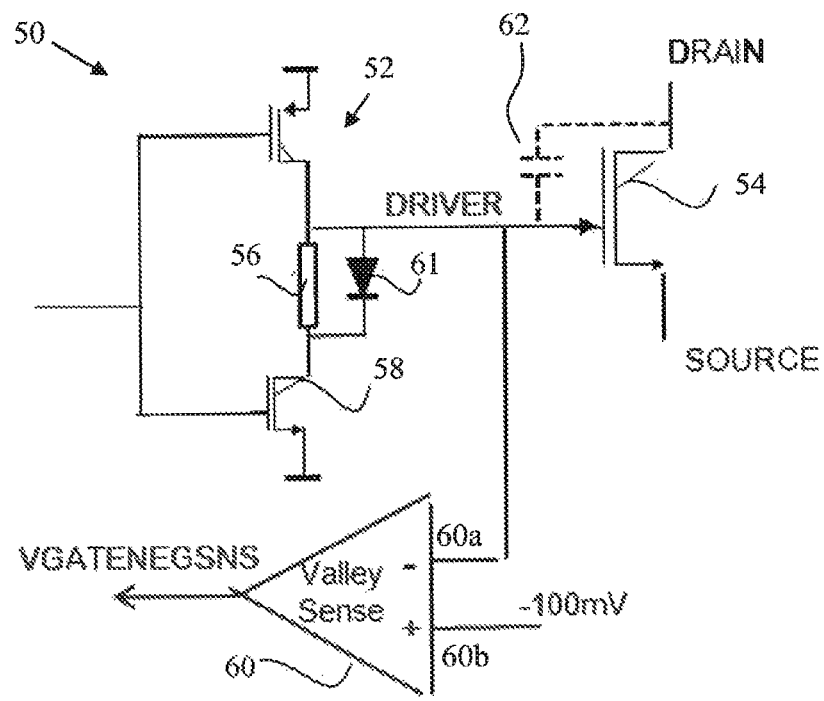
FIG. 3A is a circuit diagram of a switching circuit according to an embodiment of the invention.

FIG. 3A shows a circuit diagram of a switching circuit 50 according to an embodiment of the invention. The switching circuit 50 comprises a regulating circuit 52 connected to the gate of a MOSFET 54. The regulating circuit 52 is adapted to generate a drive signal DRIVER which is applied to the gate of the MOSFET 54. The drive signal therefore acts a control signal for the controlling operation of the MOSFET 54. Thus, based on the drive signal DRIVER applied to the gate of the MOSFET 54, the MOSFET 54 is adapted to control operation of the switching circuit 50.

The switching circuit 50 also comprises a detecting circuit adapted to sense a voltage at the gate terminal of the MOSFET when the MOSFET 54 is in an OFF state. Based on the sensed voltage, the switching circuit 50 generates a drive signal VGATENEGSNS.

Here, the detecting circuit comprises a resistor 56 connected in series with a transistor 58 of the regulating circuit 52. The detecting circuit also comprises a comparator 60 having a first input 60a connected to the gate terminal of the MOSFET 54 and a second input connected a reference voltage (of −100 mV in this embodiment). Thus, the comparator 60 is adapted to compare a voltage at the gate terminal of the MOSFET 54 with the reference voltage, and generates the drive signal VGATENEGSNS based on the result of the comparison.

The drive signal VGATENEGSNS is provided to the regulating circuit and, based on the drive signal VGATENEGSNS, the regulating circuit generates the control signal DRIVER.

The described embodiment is therefore adapted to sense the voltage of the drive signal DRIVER at the gate of the MOSFET 54. Using this gate voltage, the trough of a voltage valley can be sensed by determining the moment that the gate voltage crosses a predetermined negative value in the upward direction. It is noted that a Drain-Gate capacitance 62 is present between the drain and gate of the MOSFET. This is referred to as a Miller Capacitor 62, and typically has a high capacitance value in HV MOSFET switches. It is the current through this Miller Capacitor 62 than can be used to identify when the trough of a voltage valley in the drive signal DRIVER occurs.

Figure 3B:
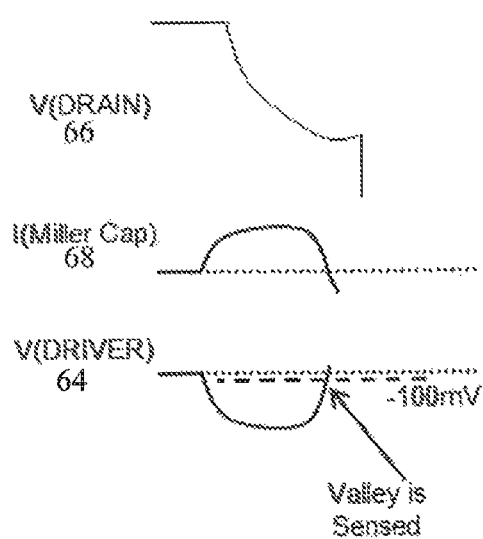
FIG. 3B shows the variation of drain voltage, miller capacitor current and drive voltage for the switching circuit of FIG. 3A.

By way of explanation, this is illustrated in FIG. 3B which shows the variation of drain voltage, miller capacitor current and drive voltage for the switching circuit of FIG. 3A during the second stroke of a switching cycle.

In the second stroke of a switching cycle, the MOSFET 54 is switched off and the gate voltage V(DRIVER) 64 is driven (through the low-side MOSFET) to ground (0 volts).

Here, the MOSFET 54 is designed to have a large pull down current capability to ensure fast turn-off. This large pull down capability is maintained by a diode 61 connected in parallel with the resistor 56.

The output current drops linearly until it reaches zero. When the output current becomes zero, the drain voltage V(DRAIN) 66 starts swinging down, and the MOSFET has to supply positive current (instead of pulling down) to the gate-drain miller capacitance I(Miller Cap) 68.

Using the resistor 56, the variation of the current to the gate-drain miller capacitance I(Miller Cap) 68 can be seen as a negative voltage swing/variation of the gate voltage V(DRIVER) 64. It is noted that the gate voltage V(DRIVER) 64 then reaches zero volts at the trough of the voltage valley/swing of the drain voltage V(DRAIN) 66. Thus, the trough of the voltage valley can be detected by sensing when the gate voltage V(DRIVER) 64 reaches or crosses zero from a negative value.

In the embodiment of FIG. 3A, the comparator 60 of the detecting circuit is adapted to compare the gate voltage V(DRIVER) 64 with a reference voltage of −100 mV. It will therefore be appreciated that such an arrangement identifies an instance just before the gate voltage V(DRIVER) 64 reaches or crosses zero from a negative value.

In alternative embodiments, the reference voltage may have a value within the range of −0.5 volts to 0.5 volts, and preferably be within the range of −0.25 volts to 0.25 volts, and even more preferably be within the range of −0.1 volts to 0.1 volts. It will therefore be appreciated that the reference may be chosen to be close to the value of zero (0) volts, depending on timing and/or accuracy requirements.

Figure 4:
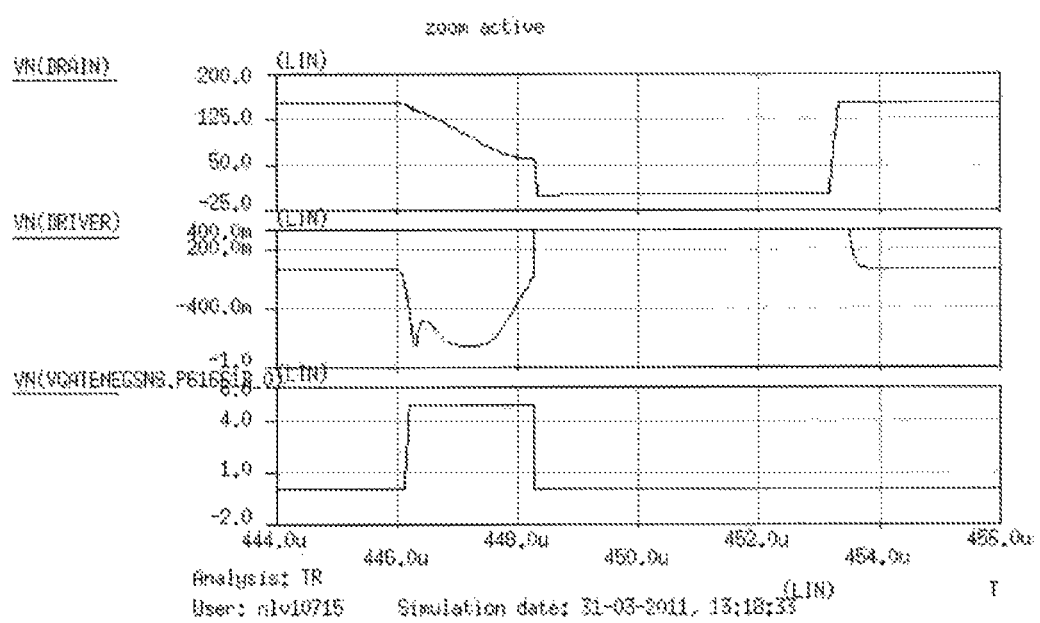
FIG. 4 illustrates simulation results for a switching circuit according to an embodiment of the invention.

Turning to FIG. 4, there are illustrated the simulation results for a switching circuit according to an embodiment of the invention. The switching circuit is adapted to detect the trough of a voltage valley (occurring in the drain voltage VN(DRAIN) of a MOSFET switch) by sensing the voltage of a drive signal VN(DRIVER) applied to the gate of the MOSFET (as described above with reference to FIGS. 3A and 3B).

Here, the "VN(GATENEGSNS)" signal is a control signal output by a comparator of the detecting circuit. It is this control signal that identifies when the voltage of the drive signal VN(DRIVER) applied to the MOSFET gate is negative (i.e. has a negative value).

The trough of the voltage valley occurring in the drain voltage VN(DRAIN) of the MOSFET is detected at the falling edge of the control signal VN(GATENEGSNS)", since this occurs when the voltage of the drive signal VN(DRIVER) turns positive. At this time, the MOSFET switch is turned on (as can be seen by the variation of the drive signal VN(DRIVER) and the MOSFET drain voltage VN(DRAIN)).

It will be appreciated that embodiments can be applied to other switching circuits using voltage valley detection by employing the concept of the detecting the voltage/current at a pin connected to the control terminal of a switch. Thus, embodiments may be useful for circuits that have a controller die driving an external switch, wherein voltage valley detection is employed to control switching of the switch. Using the "DRIVER" pin of the controller, a moment to turn-on the switch can be determined. Embodiments may therefore provide the "DRIVER" pin with dual functionality, thus removing the need for a separate/dedicated voltage valley sensing pin.

Various modifications will be apparent to those skilled in the art.

If needed, another NMOS can be placed parallel to the above driver NMOS-Resistance-diode combination, to ensure that sufficient drive is always available during turn-off of the switch. This second NMOST can be operated such that it is turned on only for the time taken for turning off the switch.

The invention claimed is:

1. A switching circuit comprising:
    a switching transistor adapted to control operation of the switching circuit according to a control signal applied to a control terminal of the switching transistor, wherein the switching transistor is a MOSFET and the control terminal comprises the gate of the MOSFET;
    a regulating circuit connected to the gate of the switching transistor and having a high-side transistor and a low-side transistor and adapted to generate the control signal; and
    a valley detecting circuit adapted to sense a voltage at the control terminal when the switching transistor is in an OFF state and to generate a drive signal according to the sensed voltage,
    wherein the regulating circuit is adapted to generate the control signal based on the generated drive signal;
    wherein the valley detecting circuit includes a comparator having a first input connected to the control terminal of the switching transistor and a second input connected to a reference voltage and wherein the valley detecting circuit is adapted to generate the drive signal based on a comparison of the sensed voltage at the first input of the comparator with the reference voltage at the second input of the comparator when the switching transistor is in the OFF state;

wherein the reference voltage is a value within the range of about −0.5 volts to about 0.5 volts; and wherein the valley detecting circuit comprises a resistor connected in series with the low side transistor of the regulating circuit and a diode connected in parallel with the resistor.

2. The switching circuit of claim 1, wherein the switching circuit is a switching convertor.

3. The switching circuit of claim 1, wherein the anode of the diode is connected to the gate of the switching transistor and the cathode of the diode is connected to the drain of the low-side transistor.

4. A method of controlling a switching circuit comprising a switching transistor having a control terminal and a regulating circuit, wherein the switching transistor is a MOSFET and the control terminal comprises the gate of the MOSFET and wherein the regulating circuit includes a high-side transistor and a low-side transistor, the method comprising:

generating a control signal;

applying the control signal to the control terminal of the switching transistor;

sensing a voltage at the control terminal when the switching transistor is in an OFF state using a valley detecting circuit;

generating a drive signal according to the sensed voltage; and wherein the control signal is generated based on the generated drive signal;

wherein generating the drive signal comprises comparing the sensed voltage at the control terminal to a reference voltage when the switching transistor is in the OFF state, wherein the reference voltage is a value within the range of about −0.5 volts to about 0.5 volts, and generating the drive signal based on a result of comparison; and wherein the valley detecting circuit comprises a resistor connected in series with the low-side transistor of the regulating circuit and a diode connected in parallel with the resistor.

5. The method of claim 4, wherein the switching circuit is a switching convertor.

6. The method of claim 4, wherein the anode of the diode is connected to the gate of the switching transistor and the cathode of the diode is connected to the drain of the low-side transistor.

* * * * *